(12) United States Patent
Hu et al.

(10) Patent No.: US 10,409,485 B2
(45) Date of Patent: Sep. 10, 2019

(54) ADAPTIVE USER INPUT DEVICE (71) Applicant: Touchplus Information Corp., New Taipei (TW)

(72) Inventors: Shih-Hsien Hu, New Taipei (TW); Yi-Feng Wei, New Taipei (TW); Yao-Chih Chuang, Tainan (TW); Chao-Fu Lin, New Taipei (TW)

(73) Assignee: TOUCHPLUS INFORMATION CORP., New Taipei (TW)

( * ) Notice: Subject to any disclaimer, the term of this patent is extended or adjusted under 35 U.S.C. 154(b) by 546 days.

(21) Appl. No.: 14/879,150

(22) Filed: Oct. 9, 2015

(65) Prior Publication Data
US 2016/0103609 A1 Apr. 14, 2016

(30) Foreign Application Priority Data

Oct. 9, 2014 (CN) .......................... 2014 1 0526889
Nov. 4, 2014 (CN) .......................... 2014 1 0611424

(51) Int. Cl.
| | |
|---|---|
| *G06F 3/0488* | (2013.01) |
| *G06F 3/044* | (2006.01) |
| *G06F 3/041* | (2006.01) |
| *H03K 17/96* | (2006.01) |
| *G08C 17/02* | (2006.01) |
| *G08C 23/04* | (2006.01) |

(52) U.S. Cl.
CPC .......... *G06F 3/04886* (2013.01); *G06F 3/044* (2013.01); *G06F 3/0416* (2013.01); *G08C 17/02* (2013.01); *G08C 23/04* (2013.01); *H03K 17/9622* (2013.01); *G06F 2203/0339* (2013.01); *G06F 2203/04808* (2013.01); *G08C 2201/30* (2013.01)

(58) Field of Classification Search
CPC ..... G06F 3/04886; G06F 3/0416; G06F 3/044
See application file for complete search history.

(56) References Cited

U.S. PATENT DOCUMENTS

| | | | | |
|---|---|---|---|---|
| 6,104,384 | A * | 8/2000 | Moon ................. | G06F 3/04886 345/168 |
| 6,340,967 | B1 * | 1/2002 | Maxted ............... | G06F 3/04883 345/156 |
| 6,429,793 | B1 * | 8/2002 | Paolini .................... | G06F 3/023 341/20 |
| 9,310,893 | B2 * | 4/2016 | Kim ...................... | G06F 3/0238 |

(Continued)

*Primary Examiner* — Ricardo Osorio
(74) *Attorney, Agent, or Firm* — WPAT, PC (57) ABSTRACT

A user input device for use with a controlled device. The user input device includes a substrate; a plurality of sensing electrodes disposed separately on or in the substrate for sensing an object; and a controller electrically coupled to the sensing electrodes and stored therein at least one virtual key allocation table, wherein the controller executes a converting operation to generate a sensed object information according to a capacitance data realized from the sensing electrodes, and generates an input command associated with a specified key in the virtual key allocation table, which corresponds to the sensed object information, for controlling the controlled device. The same sensed object information can be designed to correspond to keys of different definition under different virtual key allocation tables, and/or derive different input commands in different operational.

28 Claims, 5 Drawing Sheets

(56) References Cited

U.S. PATENT DOCUMENTS

| | | | |
|---|---|---|---|
| 2009/0160761 A1* | 6/2009 | Moosavi | G06F 3/023 345/156 |
| 2010/0164879 A1* | 7/2010 | Doktorova | G06F 3/0233 345/173 |
| 2013/0044060 A1* | 2/2013 | Lee | G06F 3/04886 345/168 |
| 2013/0135207 A1* | 5/2013 | Neil | G06F 3/0202 345/168 |
| 2014/0035865 A1 | 2/2014 | Hu | |
| 2014/0083834 A1 | 3/2014 | Chou et al. | |
| 2014/0152573 A1* | 6/2014 | Yamamoto | G06F 3/041 345/168 |
| 2014/0195724 A1* | 7/2014 | Shin | G06F 12/0246 711/103 |
| 2015/0077365 A1* | 3/2015 | Sasaki | G06F 3/1446 345/173 |
| 2015/0234499 A1 | 8/2015 | Hu et al. | |
| 2015/0293644 A1* | 10/2015 | Watanabe | G06F 3/0426 345/168 |

* cited by examiner

ADAPTIVE USER INPUT DEVICE

FIELD OF THE INVENTION

The present invention relates to an input device, and more particularly to a user input device which includes virtual keys. The present invention also relates to a method of controlling a controlled device with an adaptive user input device. The present invention further relates to a touch-sensing control system including an adaptive user input device and a controlled device.

BACKGROUND OF THE INVENTION

For facilitating interaction between users and electronic devices, electronic devices are generally provided with user input interfaces. So far, input keys has been one of the most popular user input interfaces. Even though remote controllers and touch sensing panels have been commonly used nowadays for input control, mechanical push buttons are still essential to general electronic devices for power switching, volume adjustment, brightness control, channel tuning, signal source selection, and so on. Since functions of a modern electronic device to be controlled via push buttons are diverse, some of the push buttons might be redundant for some applications. In addition, the disposition of conventional mechanical push buttons on a housing of a modern electronic device which has a thinned frame is difficult. Moreover, different models of products may need different numbers and allocations of push buttons, manufacturers would suffer from large stocks and high cost.

SUMMARY OF THE INVENTION

Therefore, the present invention provides a user input interface, which includes virtual keys adaptively defined to generate input commands according to required functions. In this way, large stocks and high cost problems can be avoided.

In a first aspect of the present invention, a user input device for use with a controlled device comprises: a substrate; a plurality of sensing electrodes disposed separately on or in the substrate for sensing an object; and a controller electrically coupled to the sensing electrodes and stored therein at least one virtual key allocation table, wherein the controller executes a converting operation to generate a sensed object information according to a capacitance data realized from the sensing electrodes, and generates an input command associated with a specified key in the virtual key allocation table, which corresponds to the sensed object information, for controlling the controlled device.

In a second aspect of the present invention, a user input device for use with a controlled device, comprises: a substrate; a plurality of sensing electrodes disposed separately on or in the substrate for sensing an object; and a controller electrically coupled to the sensing electrodes, wherein the controller executes a first converting operation to obtain a first sensed object information according to a first capacitance data realized from the sensing electrodes, and generates a first input command corresponding to the first sensed object information when being in a first operational state, and the controller executes a second converting operation to obtain a second sensed object information according to a second capacitance data realized from the sensing electrodes, and generates a second input command corresponding to the second sensed object information when being in a second operational state. The first input command generated when the object is sensed at a specified position in the first operational state is different from the second input command generated when the object is sensed at the same specified position in the second operational state.

In a third aspect of the present invention, a method of controlling a controlled device with a user input device, comprises steps of: generating a sensed object information in response to a touch-sensing operation on or above the user input device; generating an input command according to the sensed object information and a converting rule; and transmitting both the input command and the sensed object information to the controlled device, which conducts a specified operation according to the input command and/or the sensed object information.

In a fourth aspect of the present invention, a method of controlling a controlled device with a user input device, comprises steps of: generating a sensed object information in response to a touch-sensing operation on or above the user input device; generating a first input command according to the sensed object information and a first converting rule; generating a second input command according to the sensed object information and a second converting rule; and transmitting both the first input command and the second input command to the controlled device to be selected by the controlled device, wherein said controlled device conducts a specified operation according to the selected first or second input command.

In a fifth aspect of the present invention, a touch-sensing control system comprises a user input device and at least one controlled device. The user input interface, comprises: a touch sensor sensing a touch-sensing operation of an object on or above the user input device; and a conversion module in communication with the touch sensor, generating a first input command according to a sensed object information realized from the touch sensor in response to the touch-sensing operation and a converting rule. The controlled device receives both the input command and the sensed object information from the user input interface, and conducts a specified operation according to the input command and/or the sensed object information.

In a sixth aspect of the present invention, a touch-sensing control system comprises a user input device and a controlled device. The user input device comprises: a touch sensor sensing a touch-sensing operation of an object on or above the user input device; and a conversion module in communication with the touch sensor, generating a first input command according to a sensed object information realized from the touch sensor in response to the touch-sensing operation and a first converting rule, generating a second input command according to the sensed object information and a second converting rule, and transmitting both the first input command and the second input command to the controlled device to be selected by the controlled device. The controlled device receives both the first input command and the second input command from the user input device, and conducts a specified operation according to the selected first or second input command.

The invention will become more readily apparent to those ordinarily skilled in the art after reviewing the following detailed description and accompanying drawings.

DETAILED DESCRIPTION OF PREFERRED EMBODIMENTS

The invention hereinafter will be described in greater detail with preferred embodiments of the invention and accompanying illustrations. Nevertheless, it should be recognized that the preferred embodiments of the invention are not provided to limit the invention but to illustrate it. The present invention can be practiced not only in the preferred embodiments herein mentioned, but also in a wide range of other embodiments besides those explicitly described. Further, the scope of the present invention is expressly not limited to any particular embodiments except what is specified in the appended Claims.

Figure 1:
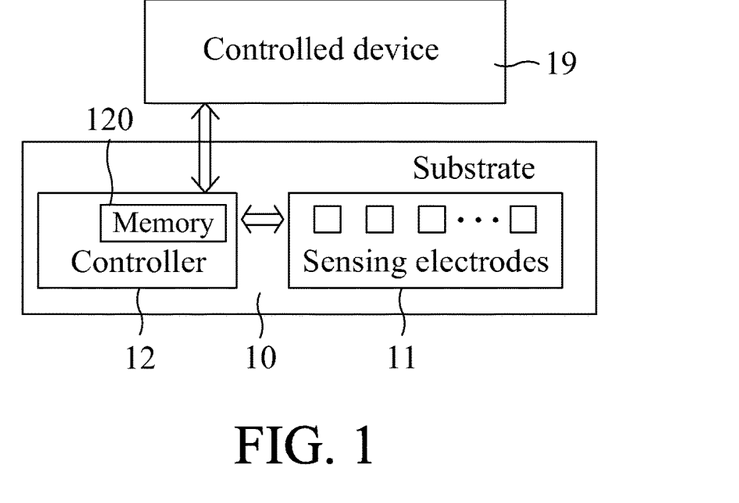
FIG. 1 is a schematic block diagram illustrating a touch-sensing control system according to an embodiment of the present invention.

Please refer to FIG. 1 which schematically illustrates a touch sensing control system according to an embodiment of the present invention. The touch sensing control system includes a user input device and a controlled device 19 to be controlled via the user input device. The user input device may be combined with a housing portion of the controlled device 19. For example, it may be disposed inside a frame of the controlled device 19 and near the frame surface so that an outer wall of the frame can be used as an input surface for a user to conduct a touch-sensing operation. It is to be noted that the term "touch-sensing" used herein and hereinafter means not only to be sensitive to a sliding or touching gesture actually acting on a specified surface but also sensitive to an air gesture floatingly acting over the specified surface. The air gesture may be a vertically moving action and/or a horizontally moving action within a specified range, or a holding-still action for a specified period of time. Hereinafter, fingers are exemplified as the tool or object for executing the gestures. However, any other suitable tool or object capable of conducting a capacitance change may be used depending on practical requirements and size of the touch-sensing electronic device. For example, palms or conductive objects may also be used instead. For large-area touch sensing, a plurality of touch sensing units may be combined to detect a capacitance change so as to effectively enhance the sensitivity and effective sensible distance.

The outer wall of the frame may be a flat surface or a curved surface, or may include a flat surface with curved edges. When the outer wall of the frame is a curved surface or includes curved parts, the touch-sensing operation can still be performed on or above the curved surface or the curved edges of the flat surface. In this way, the thickness of the frame can be reduced compared with the prior art installed with mechanical push buttons on its frame. The term "frame" used herein does not have to be a separate ring element surrounding the main body of the controlled device. Alternatively, it may indicate a shell of the controlled device. Taking a notebook computer as an example, a frame may indicate a housing enclosing the mechanical and electronic elements, and for example, the touch-sensing operation may be conducted at a flat or curved side surface of the housing.

The user input device according to an embodiment of the present invention comprises a substrate 10, a plurality of sensing electrodes 11 and a controller 12. The substrate 10 may be implemented with a rigid or a flexible insulating plate. The sensing electrodes 11 are disposed on or integrated into the substrate 10, and separate from one another. For example, the substrate 10 formed with the sensing electrodes 11 is a single layer single face or a single layer double face printed circuit board (PCB) or flexible circuit board (FPC). The controller 12 is electrically connected to each of the sensing electrodes 11 and in communication with the controlled device 19. The controller 12 includes a non-volatile memory 120 for storing at least one virtual key allocation table. When the controller 12 is in a first operational state and the sensing electrodes 11 sense a touch-sensing action of an object, e.g. a user's finger, the controller 12 executes a first converting operation to obtain a first sensed object information according to a capacitance data realized from the sensing electrodes 11. The first sensed object information indicating a touch position information of the object in this embodiment may be a coordinate data converted from a raw data such as capacitance values. Alternatively, the first sensed object information may also be a distribution pattern of the raw data. An input command is then generated according to the first sensed object information and the virtual key allocation table, and transmitted to the controlled object 19. The non-volatile memory 120 may be, for example, an erasable programmable read only memory (EPROM), an electrically erasable programmable read only memory (EEPROM) or a flash memory. Alternatively, the non-volatile memory 120 may also be a general random access memory (RAM). The virtual key allocation table may be stored in a firmware of the controlled device 19, and downloaded to the RAM of the controller from the controlled device whenever the controlled device is powered on. The RAM may be an SRAM or a DRAM.

Figure 2:
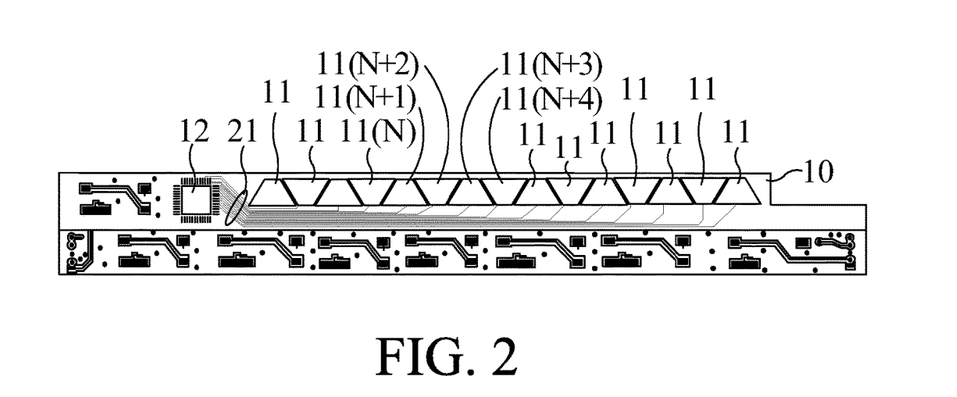
FIG. 2 is a schematic layout of sensing electrodes in a user input device according to an embodiment of the present invention.

Please refer to FIG. 2, in which an exemplified layout of the sensing electrodes 11 is schematically shown. In this example, each single sensing electrode is defined to have a shape of trapezoid and aligned in a row, and the sensing electrodes are electrically connected to the controller 12 via respective connecting lines 21. The first converting operation for obtaining the first sensed object information is performed to convert the capacitance data into a distribution pattern of capacitance differences. The sensing electrodes 11 is divided into a plurality of the sensing electrode sets according to practical requirements. Each sensing electrode set may consist of one or more sensing electrodes. The distribution pattern of capacitance differences, for example, includes a first capacitance difference between a first sensing electrode set and a second sensing electrode set adjacent to the first sensing electrode set, and a second capacitance difference between a third sensing electrode set and a fourth sensing electrode set adjacent to the third sensing electrode set, and so on.

In a specific example, as shown in FIG. 2, there are 15 sensing electrodes 11 aligned in a row, and each sensing electrode set includes two adjacent sensing electrodes. That is, a first sensing electrode set consists of the Nth sensing electrode and the (N+1)th sensing electrode, a second sensing electrode set consists of the (N+2)th sensing electrode and the (N+3)th sensing electrode, and so on. The measured capacitance values of the Nth and the (N+1)th sensing electrodes are summed to define a first capacitance value, and the measured capacitance values of the (N+2)th and the (N+3)th sensing electrodes are summed to define a second capacitance value. A capacitance different is then defined as the difference between the first capacitance value and the second capacitance value.

Figure 3:
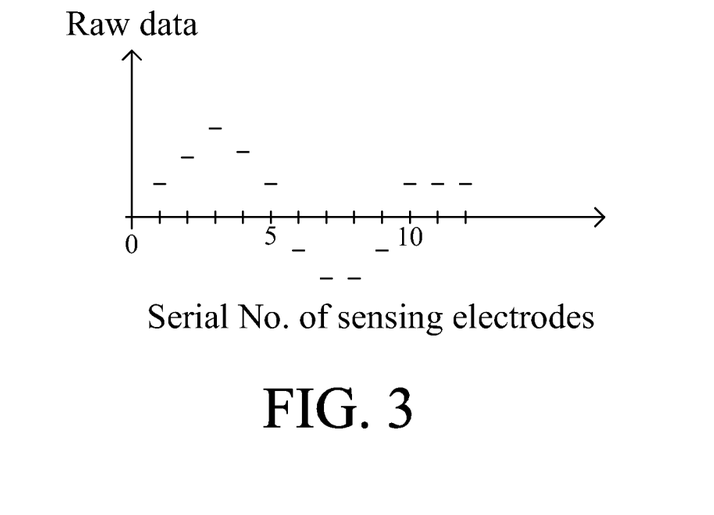
FIG. 3 is a plot showing a distribution pattern of raw data of capacitance differences.

Accordingly, an example of a distribution pattern of the capacitance differences is schematically illustrated in FIG. 3. In this example, raw data of 12 capacitance differences constitute a distribution pattern as shown. The distribution pattern can be referred to realize the sensed object information, e.g. a touch position of the object on the input surface or a gesture of one or more fingers over the input surface. Alternatively, the raw data, e.g. capacitance values, can be further converted into another sensed object information indicative of, for example, a number of touch points and/or a coordinate data. The sensed object information can be regarded as a static frame. Afterwards, an input command can be generated according to the sensed object information and a selected virtual key allocation table. In a specific embodiment, verification is performed by repeating the conversion with regrouped sensing electrodes. For example, the conversion is performed to generate the sensed object information on a condition that each sensing electrode set consists of one sensing electrode, and performed again to generate the sensed object information on a condition that each sensing electrode set consists of two adjacent sensing electrode, and then performed again to generate the sensed object information on a condition that each sensing electrode set consists of three adjacent sensing electrode. The resulting patterns obtained in three converting operations are compared according to respective raw data, thereby improving resolution. It is understood that raw data of capacitance values realized from respective sensing electrodes may also be used for obtaining the position information of the object. The basic principle and operating method are similar to the above, so it is not to be redundantly described herein.

In a specific example, the virtual key allocation table records correspondence of coordinate data to keys. Assuming that the total length of the 15 sensing electrodes is 3 inches, and the resolution of the converted coordinates is 10 DPI, it means that the user input device would include 30 identifiable points. Therefore, the virtual key allocation table can record a plurality of key positions corresponding to the 30 identifiable points so that the user input device can adaptively function as an input keypad. Different keys can be defined to exhibit different functions. Functions of virtual keys are exemplified in FIG. 4. The five virtual keys as shown include a power key 41, a channel key 42, a volume key 43, a brightness key 44 and a menu key 45. Meanwhile, Point No. 1 to 6 among the 30 identifiable points are defined to correspond to the power key 41; Point No. 7 to 12 among the 30 identifiable points are defined to correspond to the channel key 42; Point No. 13 to 18 among the 30 identifiable points are defined to correspond to the volume key 43; Point No. 19 to 24 among the 30 identifiable points are defined to correspond to the brightness key 44; and Point No. 25 to 30 among the 30 identifiable points are defined to correspond to the menu key 45. For example, when a user touches a position in a range of Point No. 13 to 18, the controller will generate and output a volume control command to the controlled device 19.

Figure 4:
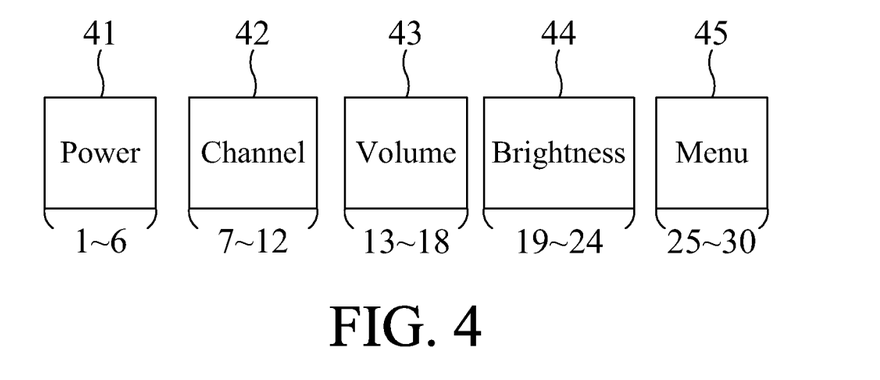
FIG. 4 is a schematic diagrams illustrating an example of virtual functional keys defined in a user input device according to the present invention.

On the other hand, if another virtual key allocation table is selectively used, the number and definition of virtual keys may change. For example, six virtual keys including a power key, a channel key, a volume key, a brightness key, a signal source key and a menu key are defined in the virtual key allocation table. Accordingly, Point No. 1 to 5 among the 30 identifiable points are defined to correspond to the power key; Point No. 6 to 10 among the 30 identifiable points are defined to correspond to the channel key; Point No. 11 to 15 among the 30 identifiable points are defined to correspond to the volume key; Point No. 16 to 20 among the 30 identifiable points are defined to correspond to the brightness key; Point No. 21 to 25 among the 30 identifiable points are defined to correspond to the signal source key; and Point No. 26 to 30 among the 30 identifiable points are defined to correspond to the menu key. In this way, keys can be adaptively defined according to practical requirements as long as a suitable virtual key allocation table is given.

Preferably, the virtual key allocation table stored in the non-volatile memory 120 is revisable. By revising the virtual key allocation table, the number and definition of virtual keys can be changed to meet the requirement of the controlled device. The revision of firmware may be executed by the controlled device 19 based on an updated virtual key allocation table downloaded from an external device, or based on an existing virtual key allocation table stored in the controlled device 19.

After an input command is issued in the first operational state, the controller 12 enters a second operational state in response to actuation of a specified virtual key. Alternatively, the second operation state may be entered when another condition is satisfied. In the second operational state, the controller 12 executes a second converting operation to obtain a second sensed object information according to a capacitance data realized from the sensing electrodes 11. For example, the second sensed object information indicates a movement track information of the object. According to the second sensed object information and referring to another virtual key allocation table, a second input command is issued. In a specific example, the first input command issued in the first operational state is a volume control command. In response to issuing the volume control command to the controlled device 19, the controller 12 enters the second operational state and a volume up command or a volume down command is issued as the second input command. Preferably, the controlled device 19, e.g. a display, simultaneously shows a literal or graphical indication of the volume up or volume down operation of the controlled device 19. The second sensed object information indicates a change of the distribution pattern within a specified time period, and can be regarded as a motion picture. The virtual key allocation table used in the second operational state may also be stored in the non-volatile memory 120 of the controller 12. In this operational state, the entire region covering all the 30 identifiable points integrally serves as a sliding sensing area. Through the converting operation, the direction and distance of the sliding track can be realized, and by referring to the corresponding virtual key allocation table, a proper action of the controlled device can thus be taken.

The user input device according to the present invention may further comprise a driving electrode electrically coupled to the controller. 12. The driving electrode is capacitive coupled to all or a part of the sensing electrodes, and disposed opposite to the sensing electrodes 11, i.e. on the backside of the substrate 10. Alternatively, the driving electrode may be disposed at the same side of the substrate 10 as the sensing electrode as long as a dielectric layer is disposed between the driving electrode and the sensing electrodes. Details of the technique can be referred to US Patent Publication Nos. 20140035865 A1 and US20140083834 A1, and will not be redundantly described herein.

Figure 5:
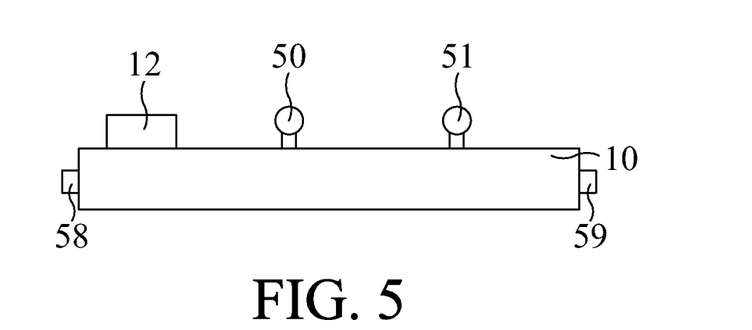
FIG. 5 is a cross-sectional view schematically illustrating a structure of a user input device according to another embodiment of the present invention.

Furthermore, as shown in FIG. 5, an LED lamp 50 and an infrared ray (IR) module 51 are optionally disposed on the substrate 10 and operate under the control of the controller 12. Desirably, the operation of LED lamp 50 synchronizes with the operational states. For example, when a specified virtual key is pressed so as to enter the first operational state, the LED lamp 50 at the same position illuminates. Afterwards, when a sliding operation on or over the input surface of the user input device is performed in the second operational state, the color of the LED lamp 50 gradually changes with the movement of the touch-sensing object. For achieving this purpose, the LED lamp 50 includes LED elements of three primary colors. The IR module 51 functions for wireless remote control of the controlled device 19. If desired, the LED lamp 50 and the infrared ray (IR) module 51 can be produced in the same package.

The controlled device 19, for example, can be a smart TV, a notebook computer, or a digital camera, which has a planar display. The substrate 10, if made of a flexible insulating material, can be used in a wearable device. For example, the substrate may be integrated with a watchband and electrically connected with the wearable device. Accordingly, a user input device according to the present invention can control the wearable device. In this case, the LED lamp 50 and the infrared ray (IR) module 51 mentioned above may perform other functions. For example, the LED lamp 50 may be used as an auxiliary indicator of the keys, or function for decorative light up. The IR module 51 is capable of emitting IR signals to control other electronic devices so that the wearable device may be used as a remote controller.

Furthermore, the user input device according to the present invention may further comprise connecting terminals 58 and 59. A first connecting terminal 58 and a second connecting terminal 59 are disposed at two ends of the substrate and electrically connected to the controller 19. By connecting the user input devices with the connecting terminals I series, i.e. connecting the first connecting terminal 58 of a user input device to the second connecting terminal 59 of a preceding user input device, the overall length and thus the overall sensing area can be enlarged. Each user input device unit included in the combined user input device may play different roles as the definitions of virtual keys in different virtual key allocation table can be different.

Figure 6:
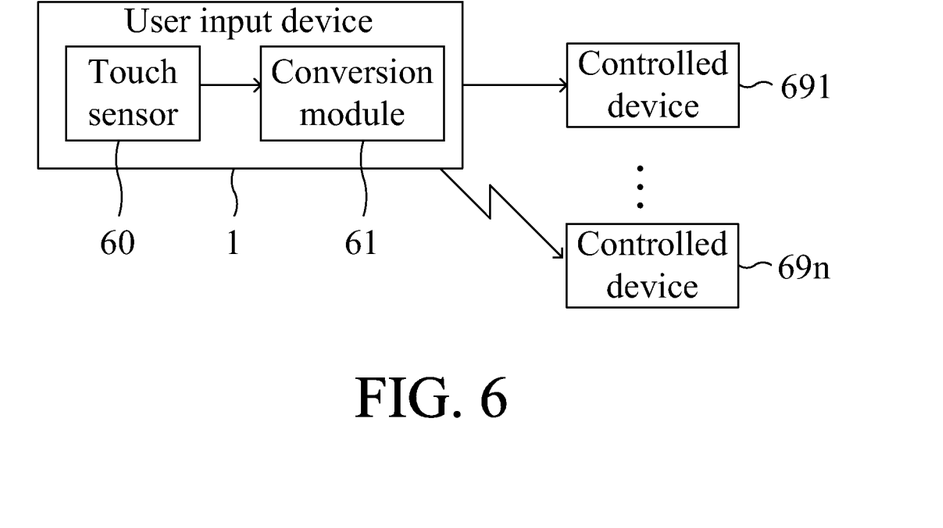
FIG. 6 is a schematic functional block diagram illustrating a touch-sensing control system according to another embodiment of the present invention.

FIG. 6 schematically illustrates a touch-sensing control system according to another embodiment of the present invention. The touch-sensing control system includes a user input device 1 and a plurality of controlled devices 691~69n to be controlled via the user input device 1. The user input device 1 includes a touch sensor 60 and a conversion module 61. The touch sensor 60 senses a touch-sensing operation on or above an input surface of the user input device. The touch sensor 60 may be a capacitive touch sensor. The types and operational principles of capacitive touch sensors have been discussed in related art, e.g. US Patent Publication Nos. 20140035865 A1, 20140083834 A1 and 20150234499, and will not be redundantly described herein. The touch sensor 60 may also be implemented with other types of sensors instead of capacitive touch sensors. Nevertheless, a capacitive touch sensor is used as an example of the touch sensor for illustrating the user input device and the touch-sensing control system according to the present invention hereinafter.

A capacitive touch sensor generally senses a touch-sensing operation, e.g. single touch, double touch, sliding or gesture, of an object. In response to the sensing result, a sensed object information is generated. The sensed object information may be a series of raw data describing a continuous action like a motion picture. Alternatively, the sensed object information may also be a raw data sensed at a specified time point, which is a projected static image data of the object on the touch sensor. For example, the sensed object information may be a digital data array correlating to capacitance values realized from the capacitor array of the touch sensor in response to the touch-sensing operation, or a digital data array correlating to capacitance differences between the capacitance values and a reference capacitance value.

The conversion module 61 is in communication with the touch sensor 60, and generates an input command according to the sensed object information realized from the touch sensor in response to the touch-sensing operation of the object, as described above, and a converting rule. Both the input command and the sensed object information are then transmitted to one or more of the controlled devices 691~69n through connecting cables or wirelessly. The wireless transmission may be, for example, WiFi, Bluetooth, radiofrequency (RF) or IR transmission, which is well known to those skilled in the art and not to be redundantly described herein. Furthermore, the input command and the sensed object information may be transmitted in the same packet, or they may be sequentially transmitted but regarded as in the same packet by downstream receiving devices due to the transmission protocol.

The converting rule mentioned above may be, for example, a coordinate converting rule which correlates a raw data to a coordinate data. In other words, the raw data associated with a touch position or a movement track of the object can be converted into coordinate data indicative of the touch position or the movement track of the object. The coordinate data is then provided for the controlled device or devices to conduct associated operation, e.g. moving a pointer of a controlled device.

In another example, the converting rule is an operation converting rule which correlates a raw data associated with a gesture to a specific operation. For example, according to the operation converting rule, the gesture raw data is converted into a triggering command so as to trigger a specified operation, e.g. a switch operation from ON to OFF or from OFF to ON, of the controlled device or devices received the triggering command.

In a further example, the operation converting rule further concerns a state condition of the controlled device. For example, one of the controlled devices is a lamp capable of emitting light selected from five levels of brightness, i.e. Level 1, 2, 3, 4, and 5. A current state information, e.g. brightness level, is stored in the conversion module 61, e.g. in a form of a counting value. If the current state information indicates that the lamp is currently at Level 1 brightness, and the touch-sensing raw data shows a triggering command of one level up, the triggering command will then result in Level 2 brightness of the lamp. If the current state information indicates that the lamp is currently at Level 5 brightness, and the touch-sensing raw data shows a triggering command of one level up, the triggering command will then result in Level 1 brightness of the lamp as a result of a cyclic switching mechanism. The touch-sensing raw data mentioned above is a touch position or a gesture data. Alternatively, the touch-sensing raw data may be a movement track data, e.g. from left to right or from right to left. In this alternative example, if the current state information indicates that the lamp is currently at Level 1 brightness, the triggering command will result in Level 2 brightness of the lamp when the touch-sensing raw data indicates a left to right movement of the object, and in contrast, the triggering command will result in Level 5 brightness of the lamp when the touch-sensing raw data indicates a right to left movement of the object. In addition to brightness level change control, the converting rule may also be designed or revised to control a number of powered-on light units included in a lamp set in a similar manner.

As mentioned above, according to an embodiment of the present invention, both the input command and the sensed object information are transmitted to the controlled devices 691~69n, any of the controlled devices 691~69n receiving the input command and the sensed object information may select the input command directly for operation control, or select raw data of the sensed object information for defining its own operation control. In other words, different controlled devices can conduct different operations in response to the same sensed object information based on respective converting rules. Therefore, the user input device can be a general type of input interface, which provides raw data, and optionally current state information, to the controlled device or devices. Then the controlled device or devices will define their own operation control according to the information received from the input interface. For example, the controlled devices 691~69n are different kinds of lamps. According to the present invention, the different kinds of lamps can be controlled with the same user interface 1 by transmitting the sensed object information to the lamps optionally together with the input commands and the current state information.

Figure 7:
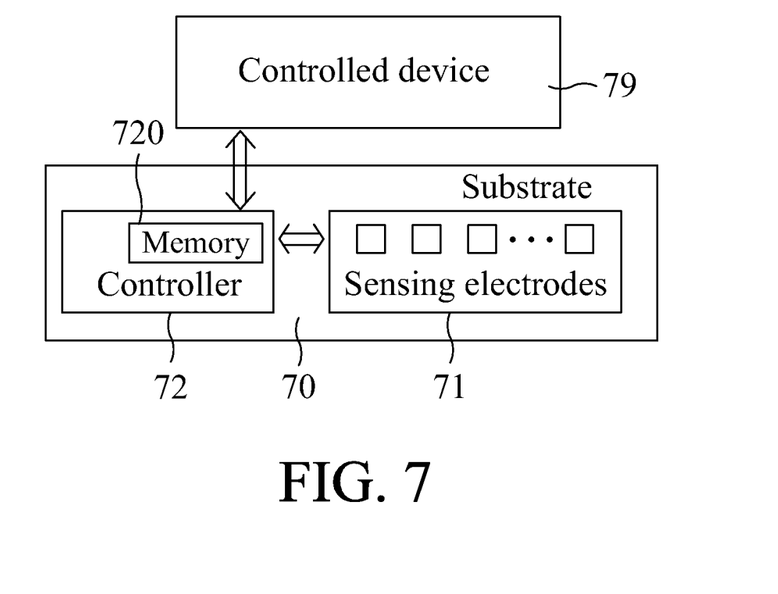
FIG. 7 is a schematic functional block diagram illustrating an example of the touch-sensing control system of FIG. 6.

FIG. 7 schematically illustrates an example of the touch-sensing control system of FIG. 6. The touch-sensing control system in this example is similar to that shown in FIG. 1 in structure, but the operation of the controller is modified.

The touch sensing control system includes a user input device and a controlled device 79 to be controlled via the user input device. The user input device comprises a substrate 70, a plurality of sensing electrodes 71 and a controller 72. The substrate 70 may be implemented with a rigid or a flexible insulating plate. The sensing electrodes 71 are disposed on or integrated into the substrate 70, and separate from one another. For example, the substrate 70 formed with the sensing electrodes 71 is a single layer single face or a single layer double face printed circuit board (PCB) or flexible circuit board (FPC). The controller 72 is electrically connected to each of the sensing electrodes 71 and in communication with the controlled device 79. The controller 72 includes a non-volatile memory 720 for storing at least one converting rule. When the sensing electrodes 71 sense a touch-sensing action of an object, e.g. a user's finger, the controller 72 executes a converting operation to obtain a sensed object information according to a capacitance data realized from the sensing electrodes 71. The sensed object information indicating a touch position information, a movement track information, or a gesture of the object, and has been described above with reference to FIG. 6.

The converting rule has been described above with reference to FIG. 6, and may also be implemented with a virtual key allocation table. It is understood that according to different converting rules, different input commands can be obtained. The controller 72 may store therein a plurality of converting rules, e.g. a plurality of virtual key allocation tables, so that a variety of input commands can be adaptively rendered even for similar touch-sensing position, track or gesture. Furthermore, similar to the embodiment described above with reference to FIG. 1, different converting rules may apply when the controller 72 is in different operational states to generate different input commands.

Figure 8A:
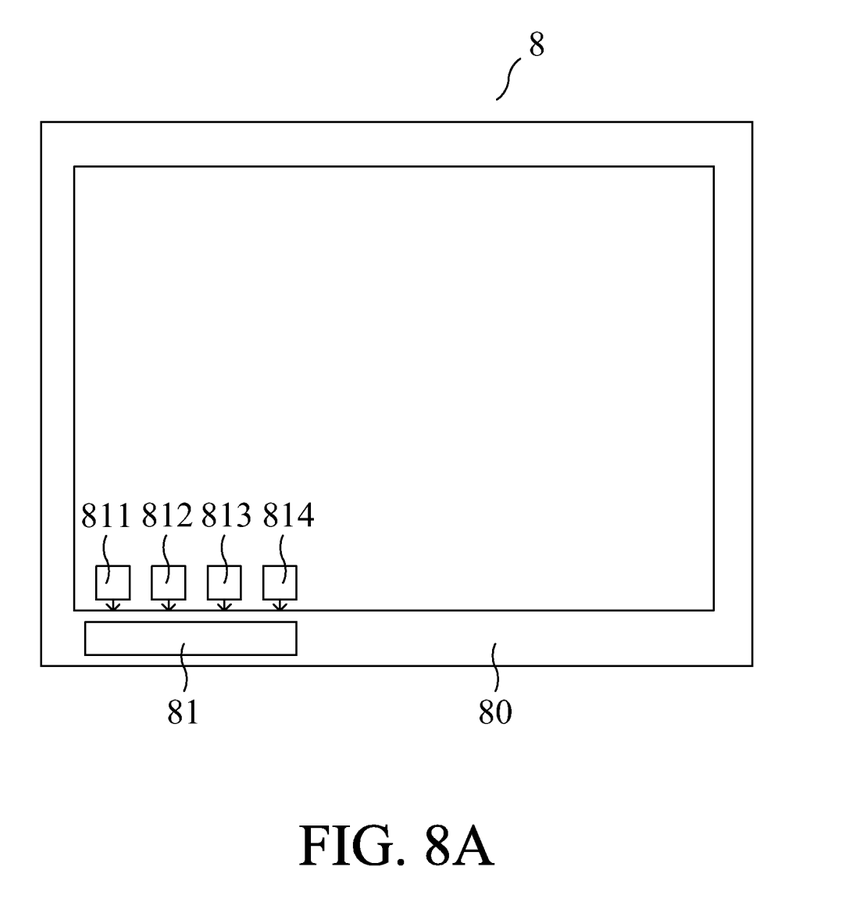
FIG. 8A and FIG. 8B are schematic diagrams illustrating examples of the use of a user input device with a display in different operational states.
Figure 8B:
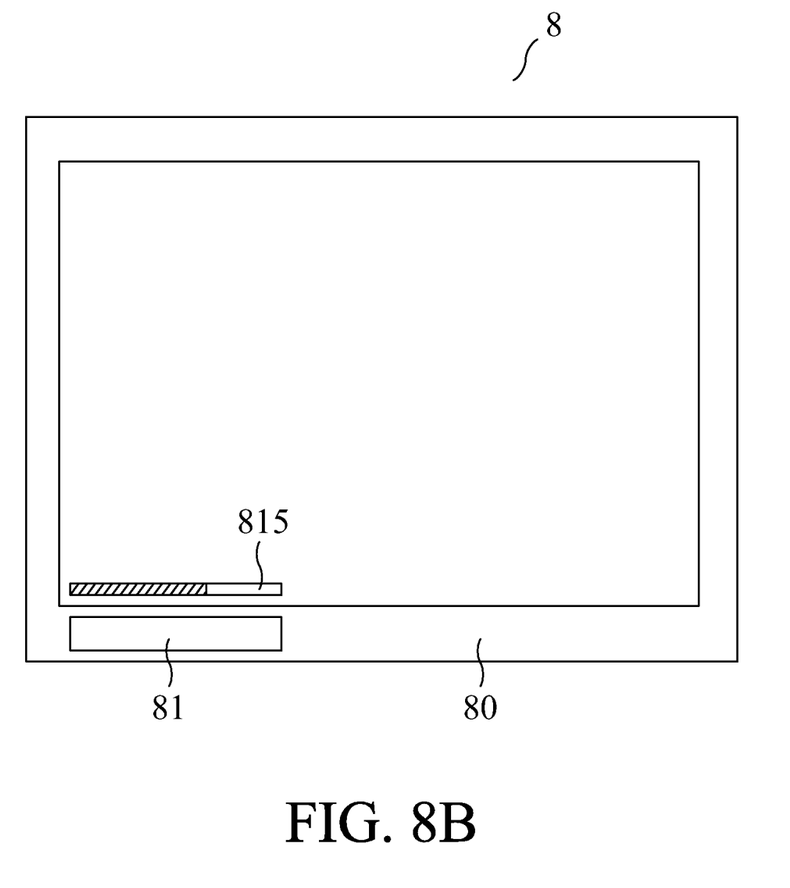

Examples of the uses of a user input device according to the present invention are illustrated in FIG. 8A and FIG. 8B. In these examples, the controlled device is a display 8. The user input device is disposed in the frame 80 of the display 8, and an outer wall of the display 8 serves as the touch-sensing surface for virtual key control of the user input interface 81. Assume that a current operational state is an audio data adjusting state. The display 8 shows four functional keys thereon, e.g. volume key 811, treble key 812, bass key 813 and balance key 814, by way of an OSD module (not shown). For this application, a virtual key allocation table for four keys is stored in the controller. When a user conducts a touch-sensing operation on or over the user input interface 81 at a position corresponding to the displayed virtual key 811, an input command for volume control is generated. Then an operational state of volume control is entered, and thus another virtual key allocation table for volume control is used instead of the virtual key allocation table for function selection. Meanwhile, a sliding bar 815 is displayed by way of the OSD module instead of the four functional keys 811~814, as shown in FIG. 8B. In response to the touch-sensing operation and referring to the suitable virtual key allocation table, an input command corresponding to the sliding control on the sliding bar 815 is generated and used for adjusting the volume of the display 8. For example, as shown in FIG. 8B, the hatch portion of the sliding bar indicates the volume level. If another function key 812, 813 or 814 are selected, the same touch-sensing operation and the same sliding bar will indicate a different input control as a different virtual key allocation table is used.

The non-volatile memory 720 may be, for example, an erasable programmable read only memory (EPROM), an electrically erasable programmable read only memory (EEPROM) or a flash memory. Alternatively, the non-volatile memory 720 may also be a general random access memory (RAM). The virtual key allocation table may be stored in a firmware of the controlled device 79, and downloaded to the RAM of the controller from the controlled device whenever the controlled device is powered on. The RAM may be an SRAM or a DRAM.

In the above embodiments and examples, a plurality of converting rules or virtual key allocation tables may simultaneously exist. The user input device according to the present invention may also transmit all the input commands, which correspond to all the existing converting rules or virtual key allocation tables in response to the same touch-sensing operation, to the controlled device. Then the controlled device can select a suitable one of the input commands for operation control.

According to the present invention, virtual keys are used in lieu of mechanical keys, and the same sensed object information can be designed to correspond to keys of different definition under different virtual key allocation tables, and/or derive different input commands in different operational states. Therefore, there would be no need to prepare different numbers and allocations of push buttons. The laboring for assembling and the cost of material can be reduced. Moreover, the electronic device can be miniaturized.

The foregoing descriptions, for purposes of explanation, used specific nomenclature to provide a thorough understanding of the invention. However, it will be apparent to one skilled in the art that specific details are not required in order to practice the invention. Thus, the foregoing descriptions of specific embodiments of the invention are presented for purposes of illustration and description. They are not intended to be exhaustive or to limit the invention to the precise forms disclosed; obviously, many modifications and variations are possible in view of the above teachings. The embodiments were chosen and described in order to best explain the principles of the invention and its practical applications; they thereby enable others skilled in the art to best utilize the invention and various embodiments with various modifications as are suited to the particular use contemplated. It is intended that the following claims and their equivalents define the scope of the invention. While the embodiments of the present invention disclosed herein are presently considered to be preferred embodiments, various changes and modifications can be made without departing from the spirit and scope of the present invention. The scope of the invention is indicated in the appended claims, and all changes that come within the meaning and range of equivalents are intended to be embraced therein.

What is claimed is:

1. A user input device for use with a controlled device, comprising:
    a substrate;
    a plurality of sensing electrodes disposed separately on or in the substrate for sensing an object; and
    a controller electrically coupled to the sensing electrodes and stored therein at least one virtual key allocation table, wherein the controller executes a converting operation to generate a sensed object information according to a capacitance data realized from the sensing electrodes, and generates an input command associated with a specified key in the virtual key allocation table, which corresponds to the sensed object information, for controlling the controlled device,
    wherein the virtual key allocation table is revisable to change number and definition of keys.

2. The user input device according to claim 1, wherein the controller stores therein at least a first virtual key allocation table and a second virtual key allocation table, which are selectively referred to for generating the input command, and the input command varies with the virtual key allocation table.

3. The user input device according to claim 1, wherein the virtual key allocation table is stored in a non-volatile memory of the controller.

4. The user input device according to claim 1, wherein the virtual key allocation table is downloaded from an external device and revisable by way of the controlled device.

5. The user input device according to claim 1, wherein the substrate is a rigid or flexible insulating plate disposed inside a frame of the controlled device, and a user executes a touch control operation with the object on or above a flat or curved outer wall of the frame.

6. The user input device according to claim 1, wherein when an operational state of the controller changes, the virtual key allocation table referred to for the converting operation is changed.

7. The user input device according to claim 1, further comprising a first connecting terminal and a second connecting terminal disposed at two ends of the substrate and electrically connected to the controller, wherein one or both of the first connecting terminal and the second connecting terminal are optionally electrically connected to another user input device or other user input devices to extend a sensing area.

8. The user input device according to claim 1, wherein the sensed object information is a coordinate data.

9. The user input device according to claim 1, wherein the sensed object information is a distribution pattern of capacitance differences.

10. A method of controlling a controlled device with a user input device, comprising steps of:
    generating a sensed object information in response to a touch-sensing operation on or above the user input device;
    generating an input command according to the sensed object information and a converting rule; and
    transmitting both the input command and the sensed object information to the controlled device, which conducts a specified operation according to the input command and/or the sensed object information,
    wherein the sensed object information is a raw data or a series of raw data generated at different time points.

11. The method according to claim 10, wherein the raw data and the input command are transmitted to the controlled device in a packet.

12. The method according to claim 10, wherein the raw data is a digital data array correlating to capacitance values realized in response to the touch-sensing operation.

13. The method according to claim 10, wherein the raw data indicates an image data of an object conducting the touch-sensing operation.

14. The method according to claim 10, wherein the converting rule is implemented with a virtual key allocation table.

15. The method according to claim 10, wherein the converting rule is a coordinate converting rule.

16. The method according to claim 10, wherein the converting rule is an operation converting rule.

17. The method according to claim 10, wherein the converting rule is a state-switching rule.

18. The method according to claim 17, wherein the converting rule refers to a current state information.

19. A touch-sensing control system, comprising:
    a user input device, comprising:
        a touch sensor sensing a touch-sensing operation of an object on or above the user input device; and
        a conversion module in communication with the touch sensor, generating a first input command according to a sensed object information realized from the touch sensor in response to the touch-sensing operation and a converting rule; and
    at least one controlled device receiving both the input command and the sensed object information from the user input device, and conducting a specified operation according to the input command and/or the sensed object information,
    wherein the sensed object information is a raw data or a series of raw data generated at different time points.

20. The touch-sensing control system according to claim 19, wherein the touch-sensing control system comprises a plurality of controlled devices, and the controlled devices conduct different operations according to the sensed object information.

21. The system according to claim 19, wherein the raw data and the input command are transmitted to the controlled device in a packet.

22. The system according to claim 19, wherein the raw data is a digital data array correlating to capacitance values realized in response to the touch-sensing operation.

23. The system according to claim 19, wherein the raw data indicates an image data of an object conducting the touch-sensing operation.

24. The system according to claim 19, wherein the converting rule is implemented with a virtual key allocation table.

25. The system according to claim 19, wherein the converting rule is a coordinate converting rule.

26. The system according to claim 19, wherein the converting rule is an operation converting rule.

27. The system according to claim 19, wherein the converting rule is a state-switching rule.

28. The system according to claim 19, wherein the converting rule refers to a current state information.

* * * * *